United States Patent Office 3,582,415

Patented June 1, 1971

3,582,415
METHOD OF ETCHING Cu WITH USE OF Pb AND Sn LAYERS AS A MASK

Michael Gulla, Auburndale, Mass., assignor to Shipley Company, Inc., Newton, Mass.

No Drawing. Original application Oct. 22, 1966, Ser. No. 509,412. Divided and this application Jan. 9, 1969, Ser. No. 810,426

Int. Cl. C23f *1/02;* H05k *3/06*

U.S. Cl. 156—11 10 Claims

ABSTRACT OF THE DISCLOSURE

A process for plating a cupreous surface comprising first plating said surface with immersion lead and thereafter plating with immersion tin. The process is particularly applicable to the formatiion of printed circuit boards where the steps would comprise applying a negative plating resist in an image pattern over an insulating substrate having a surface of cupreous metal, the exposed area of said metal not covered by the resist defining a desired conductor pattern, providing a lead coating over the exposed metal by immersion plating, providing an immersion plating of tin over the lead, removing the plating resist and etching metal exposed by removal of the plating resist.

This application is a division of copending U.S. patent application Ser. No. 509,412 filed Oct. 22, 1966, now abandoned.

This invention relates to the chemical plating over cupreous surfaces of lead by immersion, with or without a further coating of immersion tin, especially useful in the manufacture of printed circuits. Immersion plating refers to the chemical deposit of solution metal by displacement of copper in the absence of an external electric current. Cupreous surfaces are those of copper or copper based alloys.

The principal objects of the invention include provision of novel immersion lead plating solutions or baths, improved methods of making printed circuits therewith, and provision of a novel method of plating combined coatings of lead and tin. Other and further objects and advantages will be apparent from the following description.

One prior method of manufacturing printed circuits comprises applying a negative plating resist onto unwanted portions of the surface of a copper foil adhered to an electrically insulating substrate, electroplating solder comprising approximately equal amounts of lead and tin over the copper not covered with plating resist, removal of the plating resist, and the etching away of the unwanted copper exposed by removal of the plating resist. The negative plating resist can comprise, for example, insulating photoresists or an insulating ink composition applied by silk screen. The solder serves as a resist to the etchant which is typically a chromic acid composition. This process requires connection for electroplating and an electroplating time of about 20 to 30 minutes. Coating thicknesses of solder typically are 1 mil or more.

It has now been found that an improved process is provided by utilizing a plate of immersion lead as the etchant resist. An adequate thickness of lead, typically 50 to 70 millionths of an inch, can be provided merely by immersion, spraying or the like without the necessity of electroplating connections. The lead coating is usually obtained in about 2 to 5 minutes, and additional time up to one hour has no appreciable effect. This results in a simple process with a considerable saving of time and expense, requires less expensive equipment and lends itself much more readily to automated manufacture. Further advantages include the greater ease of removal of etchant resist where desired to provide an all-copper circuit, absence of overhang of etchant resist as the edges of underlying copper are etched away, the thin lead coating being frangible to maintain a sharp edge with the copper, and the combination of immersion tin over the immersion lead provides excellent solderability of circuit components and excellent corrosion and abrasion resistance. Applications of tin over the lead, after etching, also provides a coating of tin over the side edges of the copper conductors for uniform protection and appearance.

It has also been found that the use of immersion lead has the still further advantage that after-plating with immersion tin results unexpectedly in a much greater thickness of total deposit than can be obtained with either alone. Such greater thicknesses have a number of advantages and are specified for some applications. For example, tin plating is widely employed for corrosion resistance and to form contact fingers for a printed circuit and the greater thickness is a distinct advantage. Thus, in one aspect, this invention comprises the process of first plating immersion lead over copper and thereafter plating with immersion tin wherever thicker coatings are advantageous.

In a further aspect, the invention includes the method of making printed circuits comprising (a) providing an insulating substrate having a surface of cupreous metal, (b) applying a negative plating resist in a pattern over said metal surface, the exposed areas of the metal not covered by said resist defining the desired conductor pattern, (c) providing a lead coating over said exposed metal by immersion plating, (d) removing said plating resist, and (e) etching the metal exposed by removal of said plating resist. This process is applicable to circuits entirely on a single side of the substrate or to circuits on both sides employing through-hole connections therebetween.

Where an all-copper circuit is desired, the lead may be readily etched away with a suitable etchant, for example, one-fourth pound of cupric chloride per gallon of dilute (33% by volume) hydrochloric acid. Since the lead coating is only a small fraction of the thickness of the conventional plating solder, it is much more readily and quickly removed.

Preferably, however, the lead coating is not removed but is overplated with immersion tin. Most preferably, the tin is applied over the lead after the unwanted copper is etched, thereby coating the exposed edges of the conductors as well as the lead. Alternatively, immersion tin can be applied to the lead prior to removal of the plating resist. Where this is done, copper etchants based on ammonium persulfate can also be employed since the tin is resistant thereto while the lead is not. However, chromic acid etchants are preferred.

In a still further aspect of the present invention, novel immersion lead compositions are provided which comprise (1) a source of plumbous ions in a quantity sufficient to provide a useful deposit, thiourea in an amount sufficient to complex the plumbous ions, and an acid in which said plumbous ion source is soluble in an amount sufficient to provide a pH not greater than about 2, preferably not greater than about 1, and most preferably less than about 0.3. Any suitable sources of soluble plumbous ions can be employed, for example plumbous fluoborate or plumbous acetate. While thiourea is the preferred complexing agent, known equivalents therefor, generally derivatives thereof, are known. Such derivatives are disclosed in prior patents, for example, in U.S. Pat. No. 2,891,871. It is preferred that all or a portion of the acid comprise fluoroboric acid in which the lead salts have good solubility and from which the lead is readily deposited. However, other mineral acids or mixtures thereof with organic acids which do not precipitate the complexed lead can be used.

While the above compositions are useful to plate lead they are sometimes difficult to control, especially in high concentration or at high temperature. It is therefore preferred to include a controller of the rate and quality of lead deposit. Such controllers comprise a soluble source of metal ions other than lead which can also be deposited from the acid-thiourea solution, and include the platinum metals, preferably of plus two valency and including particularly palladium and rhodium, silver, mercury (mercuric), tin (stannous) and gold. Of the specifically named metal controllers, gold is the least effective, while mercury and tin are preferred.

Suitable compositions are shown in Table I below:

TABLE I

| Ingredient | Example 1 | 2 | 3 | 4 | 5 | 6 |
|---|---|---|---|---|---|---|
| HCl (37%), ml | | | 25 | | 25 | |
| $H_3PO_4$(85%), ml | 50 | | 25 | | 25 | 50 |
| $H_2SO_4$(96%), ml | | | | 50 | | |
| $HBF_4$ (50%), ml | 50 | 120-200 | 100 | 25 | 50 | 100 |
| Lead fluoborate (50%), g | 30 | 30 | 100 | | 30 | 200 |
| Thiourea, g | 50 | 30 | 100 | 75 | 50 | 250 |
| Lead acetate, g | | | | 33 | | |
| Tin fluoborate (50%), g | 1-2 | 1.5 | 2-6 | | 2 | 35-60 |
| Water, to 1 liter | 1 | 1 | 1 | 1 | 1 | 1 |
| Preferred temp., ° F | 165 | 165 | 165 | 75 | 165 | 210 |
| Preferred time, min | 2 | 2 | 2 | 5 | 2 | 2 |

In the above examples, the acids provide desired pH and are chosen on the basis of their compatibility with the lead ions. The stannous fluoroborate is the control agent for the rate of the displacement reaction by which lead is plated at the placement of copper and which maintains the quality of deposit throughout. It is also preferred to incorporate in the above examples a surfactant stable at low pH, for example about 2 grams per liter, to provide a lower surface tension at the substrate and solution interface for uniformity of coverage.

In the above examples and in compositions useful according to this invention, the amount of the lead salt is not critical provided sufficient is employed for a useful deposit and too great an excess for an uncontrolled reaction is avoided. The thiourea or its equivalents should be employed in a quantity sufficient to complex the lead ions. The weight ratio of thiourea to lead (metal only) should be between about 1 to 2 and 1 to 10. Increasing concentration of thiourea increases the potential of displacement and requires the use of somewhat greater amounts of controlling agent for uniform results. Percentages given for example materials are by weight.

The controlling agent, where necessary, should be employed in amounts greater than incidental impurities up to an amount not exceeding 20 percent by weight of the combined weight of tin and lead metals present. More preferably, it does not exceed 10 percent of said combined weight. The amount necessary for best results will increase with increase in operating temperature and in the concentration of lead, thiourea or both. Use of controller is indicated when the rate of deposit is so rapid as to result in a lead deposit which is heavy, porous, or inadequately adherent. Sufficient controller should then be used to provide a dense, non-porous deposit. A series of samples can be prepared, for example, differing solely by controller content, tested and the one providing best results selected. This is readily determined visually, and, within considerable limits, amounts are not critical.

Other controlling agents which can be used in the above examples in replacement of or in combination with the tin salt are silver, for example, silver nitrate or silver oxide; palladium, for example palladium chloride; mercuric salts, for example mercuric acetate; rhodium, for example rhodium sulfate; or less preferably soluble gold salts. They are used in amounts generally similar to those for tin and in any event in amounts less than 20 percent of the combined weight of controller metal and lead metal present. Excessive amounts cause lead deposit to substantially cease with deposit of substantially pure controller metal.

Of the above examples, Example 2, with about 120 ml. of $HBF_4$ is most preferred while Example 6 is least preferred.

Suitable immersion baths for tin are known and are disclosed, for example, in U.S. Pat. No. 2,981,871.

A suitable example is as follows:

Stannous chloride—20 grams/liter $H_2O$
Thiourea—90 grams/liter $H_2O$
Hydrochloric acid—20 grams/liter $H_2O$
Temperature—165° F.
Dwell—10–30 minutes Suitable chromic acid etching compositions are also known. A suitable composition is as follows:

Chromic trioxide—110 grams
Sulfuric acid—40 ml.
Volume, $H_2O$ to make 1000 ml.
Temperature—100° F.
Dwell—Long enough to etch copper—usually 2–10 minutes.

In the foregoing disclosure it is to be understood that conventional steps of cleaning and rinsing between plating operations are to be observed in accordance with presently understood procedures.

It should be further understood that the foregoing description is for the purpose of illustration and that the description includes all modifications within the scope of the appended claims.

I claim:

1. In a method for preparing a printed circuit including the steps of providing an insulating substrate having a surface of cupreous metal, applying a plating resist in a pattern over said metal surface to define a conductor pattern, providing an etch resist over the exposed cupreous surface, removing said plating resist, and etching the metal exposed by removal of said plating resists, the improvement comprising formation of said etch resist by first plating said cupreous surface with immersion lead from an aqueous solution by displacement in the absence of an external electric current and thereafter plating said surface with immersion tin from an aqueous solution by displacement in the absence of an external electric current, whereby an etch resist of substantial thickness is obtained.

2. The method according to claim 1 wherein said lead is plated from an aqueous solution of an effective amount of a source of plumbous ions sufficient to provide a useful lead deposit, an effective amount of thiourea sufficient to complex said ions, and acid in which said complexed ions are soluble sufficient to provide a pH not greater than about 2.

3. The method according to claim 2 wherein said lead solution also includes as controller an effective amount greater than incidental impurities of a source of metal ions other than lead depositable from said acid-thiourea solution selected from the group consisting of stannous tin, mercuric mercury, a platinum metal, silver and gold, said controller being present in an amount not exceeding about 1 part controller metal per 4 parts by weight lead.

4. The method of making a printed circuit comprising (a) providing an insulating substrate having a surface of cupreous metal, (b) applying a negative plating resist in a pattern over said metal surface, the exposed areas of the metal not covered by said resist defining the desired conductor pattern, (c) providing a lead coating of at least 50 millionths of an inch in thickness over said exposed metal by immersion plating from an aqueous solution by displacement in the absence of an external electric current, said aqueous solution comprising a source of plumbous ions in an effective amount sufficient to provide a useful lead deposit, and effective amounts of thiourea sufficient to complex said ions, and acid in which complex ions are soluble sufficient to provide a pH not greater than about 2, (d) removing said plating resists, and (e) etching the metal exposed by removal of said plating resists.

5. The method according to claim 4 further comprising the step of providing an immersion plating of tin over said lead, said immersion tin being deposited by displacement from an aqueous solution in the absence of an external electric current.

6. The method according to claim 4 further comprising the step of providing an immersion plating of tin over said lead prior to removal of said etching resist.

7. The method according to claim 4 further comprising the step of removing said immersion lead plating from said copper to provide an all copper circuit.

8. The method according to claim 7 wherein said lead solution also includes as controller an effective amount greater than incidental impurities of a source of metal ions other than lead depositable from said acid-thiourea solution selected from the group consisting of stannous tin, mercuric mercury, a platinum metal, silver and gold, said controller being present in an amount not exceeding about 1 part controller metal per 4 parts by weight lead.

9. The method according to claim 8 wherein said controller metal is stannous tin.

10. The method according to claim 8 further comprising the step of plating tin over said lead.

References Cited

FOREIGN PATENTS 590,585 1/1950 Canada ------------- 156—11

JACOB H. STEINBERG, Primary Examiner

U.S. Cl. X.R.

156—13, 3; 117—71